(12) United States Patent
Phaneuf

(10) Patent No.: US 8,068,028 B2
(45) Date of Patent: Nov. 29, 2011

(54) ENCAPSULATED RFID DEVICE FOR FLEXIBLE, NON-PLANAR OR CURVILINEAR SURFACES

(75) Inventor: Peter C. Phaneuf, Grand Rapids, MI (US)

(73) Assignee: Avery Dennison Corporation, Pasadena, CA (US)

( * ) Notice: Subject to any disclaimer, the term of this patent is extended or adjusted under 35 U.S.C. 154(b) by 343 days.

(21) Appl. No.: 12/238,519

(22) Filed: Sep. 26, 2008

(65) Prior Publication Data

US 2010/0079286 A1 Apr. 1, 2010

(51) Int. Cl.
*G08B 13/14* (2006.01)
(52) U.S. Cl. ................................ 340/572.1; 340/572.8
(58) Field of Classification Search ............... 340/572.1, 340/572.7, 572.8, 10.1; 235/385; 156/60, 156/61
See application file for complete search history.

(56) References Cited

U.S. PATENT DOCUMENTS

| | | | | |
|---|---|---|---|---|
| 6,100,804 A | * | 8/2000 | Brady et al. | 340/572.7 |
| 6,265,977 B1 | * | 7/2001 | Vega et al. | 340/572.7 |
| 7,405,656 B2 | * | 7/2008 | Olsen | 340/572.1 |
| 2008/0275327 A1 | * | 11/2008 | Faarbaek et al. | 600/382 |
| 2009/0079545 A1 | * | 3/2009 | Chow et al. | 340/10.1 |
| 2009/0272814 A1 | * | 11/2009 | Granhed et al. | 235/492 |

* cited by examiner

*Primary Examiner* — George Bugg
*Assistant Examiner* — Kerri McNally

(57) ABSTRACT

An encapsulated device and method for fabricating a radio frequency identification (RFID) device is disclosed herein. The method includes providing a first substrate layer, the first substrate layer including at least one cavity; placing a RFID tag into the cavity; placing a second substrate layer over the first substrate layer, the at least one cavity of the first substrate layer being covered by the second substrate layer; and attaching the second substrate layer to the first substrate layer, the second substrate layer forming a pocket with the first substrate layer.

13 Claims, 3 Drawing Sheets

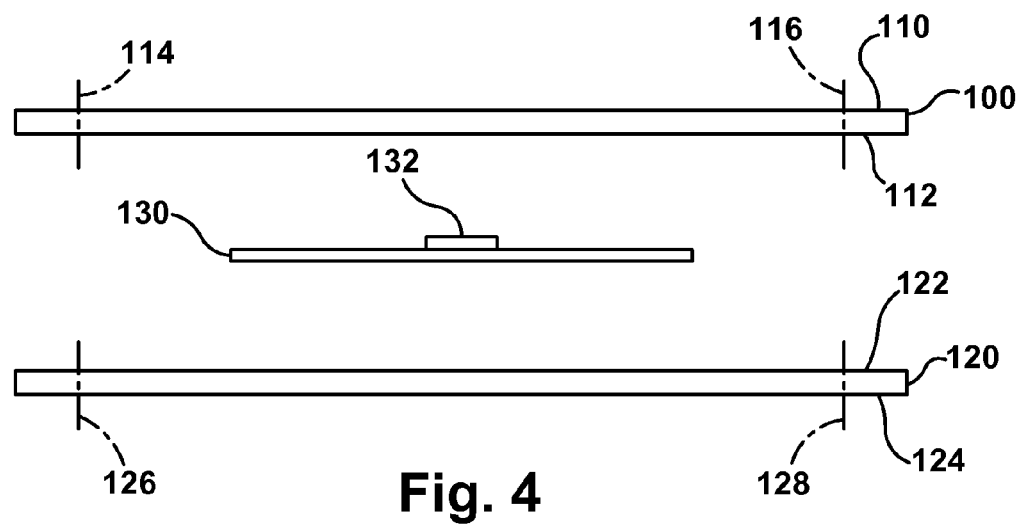
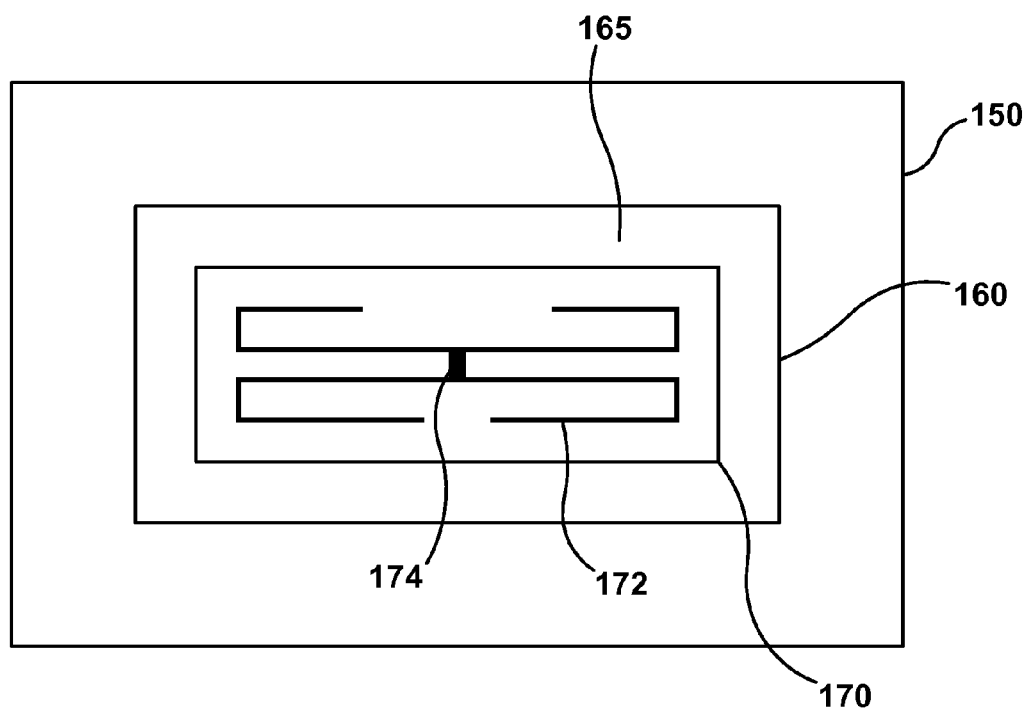

ENCAPSULATED RFID DEVICE FOR FLEXIBLE, NON-PLANAR OR CURVILINEAR SURFACES

FIELD OF THE INVENTION

The invention is in the field of radio frequency (RF) communication devices. More particularly, the present invention relates generally to the manufacturing of radio frequency identification (RFID) devices and for creating encapsulated RFID devices for use with non-planar or curvilinear surfaces or flexible articles.

BACKGROUND OF THE INVENTION

Radio frequency identification (RFID) tags and labels (collectively referred to herein as "devices") are widely used to associate an object with an identification code or other information. RFID devices generally have a combination of antennas and analog and/or digital electronics, which may include for example communications electronics, data memory, and control logic. For example, RFID tags are used in conjunction with security locks in cars, for access control to buildings, and for tracking inventory and parcels.

As noted above, RFID devices are generally categorized as labels or tags. RFID labels are RFID devices that are adhesively or otherwise attached directly to objects. RFID tags, in contrast, are secured to objects by other means, for example by use of mechanical fastener (screw, rivet, etc.) or other fastening means.

RFID devices include active tags and labels, which contain a power source for broadcasting signals, and passive tags and labels, which do not. In the case of passive devices, in order to retrieve the information from the chip, a "base station" or "reader" sends an excitation signal to the RFID tag or label. The excitation signal energizes the tag or label, and the RFID circuitry transmits the stored information back to the reader. The RFID reader receives and decodes the information from the RFID tag. In general, RFID tags can retain and communicate enough information to uniquely identify individuals, packages, inventory and the like. RFID tags and labels also can be characterized as to those to which information is written only once (although the information may be read repeatedly), and those to which information may be written to repeatedly during use. For example, RFID tags may store environmental data (that may be detected by an associated sensor), logistical histories, state data, etc.

RFID devices further can be characterized as passive, semi-passive, and active RFID devices. Passive RFID devices have no internal power supply. Power for operation of passive RFID devices is provided by the energy in an incoming radio frequency signal received by the device. Most passive RFID devices signal by backscattering the carrier wave from an RF reader. Passive RFID devices have the advantage of simplicity and long life, although performance of them may be limited.

An exemplary process for manufacturing RFID tags and label is known as "strap attach." In this process, an intermediate connection lead, a strap, instead of bonding bare dies directly onto the substrates. This is because as the chips become smaller, the process of interconnecting IC chips with antennas becomes more difficult. Thus, to interconnect the relatively small IC chips to the antennas in RFID inlays, intermediate structures variously referred to as "strap leads," "interposers," and "carriers" are sometimes used to facilitate inlay manufacture. The intermediate structures include conductive leads or pads that are electrically coupled to the contact pads of the chips for coupling the chips to the antennas. These leads provide a larger effective electrical contact area between the chips and the antenna than do the contact pads of the chip alone. With the use of the intermediate structures, the alignment between an antenna and a chip does not have to be as precise during the direct placement of the chip on the antenna as without the use of such strap leads. Further information on the use of manufacturing RFID tags using straps may be found in co-owned U.S. Pat. No. 6,951,596, the description and drawings of which are hereby incorporated by reference.

Regardless of how the chip is attached to the antenna, either directly or through a strap, one issue that is encountered during the use of the RFID tag is when the label or tag is attached to a non-planar or curvilinear article or wall of a package or a flexible article such as a garment, and the label or tag does not remain on a completely flat surface or alternatively, the label or tag is attached to the package at other than a 180 degree angle, such as around a curved surface or a corner or an edge. As the labels are bent, the die/antenna juncture is subject to stress and may fracture or break causing the RFID device to fail. In addition, the antenna may also be subject to bending or flexing and having its functionality compromised thereby. For example, the antenna may become detached from the substrate as the label bends. The same issues occur when the RFID tag is attached to a flexible article that is subject to bending, such as an article of clothing or fabric material. Other bendable materials include sheets of plastic or metal.

Accordingly, there is a long-felt, but as yet unsatisfied need in the RFID device manufacturing field to be able to produce RFID devices that address the deficiencies noted above.

BRIEF SUMMARY OF THE INVENTION

The embodiments of the present invention described below are not intended to be exhaustive or to limit the invention to the precise forms disclosed in the following detailed description. Rather, the embodiments are chosen and described so that others skilled in the art may appreciate and understand the principles and practices of the present invention.

This invention provides an RFID tag that is intended to overcome the foregoing drawbacks, namely to provide an RFID tag that can withstand additional stresses such as when being applied to non-planar surfaces or flexible articles.

In one preferred embodiment, a method for fabricating a radio frequency identification (RFID) device includes providing a first substrate layer, the first substrate layer including at least one cavity; placing a RFID tag into the cavity; placing a second substrate layer over the first substrate layer, the at least one cavity of the first substrate layer being covered by the second substrate layer; and attaching the second substrate layer to the first substrate layer, the second substrate layer forming a pocket with the first substrate layer.

In another preferred embodiment, a radio frequency identification (RFID) device is disclosed. The RFID device includes a first substrate layer, the first substrate layer including at least one cavity formed therein. The RFID device also includes a second substrate layer attached to the first substrate layer and sealed to create a pocket with the at least one cavity of the first substrate layer. An RFID tag is contained within the cavity.

In yet another exemplary embodiment of the presently described invention, an RFID device is described which includes a housing that has a cavity contained therein, the housing has a first dimension. An RFID inlay is provided that has a second dimension, which is less than the first dimension of the cavity and the RFID inlay is held within the cavity.

In a still yet further exemplary embodiment of the presently described invention an RFID device is described in which the RFID tag is attached to a package. A housing that has a cavity provided therein is attached to the package. The cavity has an RFID inlay disposed therein and the RFID inlay includes an electronic product code related to the package. The RFID device can float within the cavity.

In a further exemplary embodiment, an RFID device for use on curvilinear surfaces or flexible articles, is presented and includes first flexible material that has a first face and a second face. A second flexible material has a first face and a second face. An RFID inlay is disposed between the second face of the first flexible material and the first face of the second flexible material, the RFID inlay having a first dimension. An encapsulation zone is provided between the first and second flexible materials and has a second dimension larger that the first dimension. The RFID inlay is enclosed within the encapsulation zone and is free floating.

Other features and advantages of the present invention will become apparent to those skilled in the art from the following detailed description. It is to be understood, however, that the detailed description of the various embodiments and specific examples, while indicating preferred and other embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

These, as well as other objects and advantages of this invention, will be more completely understood and appreciated by referring to the following more detailed description of the presently preferred exemplary embodiments of the invention in conjunction with the accompanying drawings, of which:

FIG. 4 is an exploded view of the RFID device;

FIG. 5 is a perspective view of the RFID device enclosed in the encapsulation zone or cavity;

Like numerals refer to like parts throughout the several views of the drawings.

DETAILED DESCRIPTION OF THE INVENTION

Figure 1:
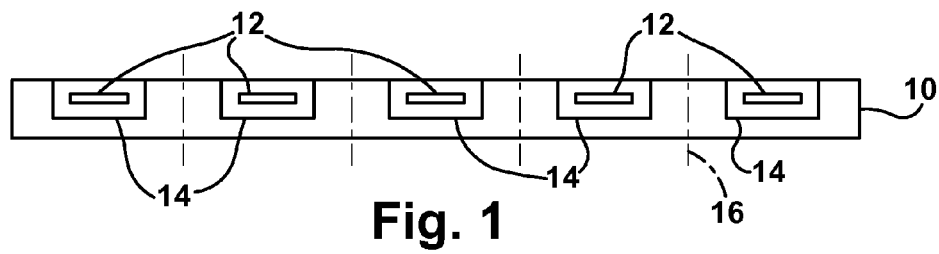
FIG. 1 depicts a side elevation of a series of cavities formed in a flexible material having RFID devices deposited in each of the cavities.

The present invention is now illustrated in greater detail by way of the following detailed description which represents the best presently known mode of carrying out the invention. However, it should be understood that this description is not to be used to limit the present invention, but rather, is provided for the purpose of illustrating the general features of the invention.

Unlike conventional RFID tags (an inlay including a chip or strap connected to an antenna on a carrier such as film or paper or a chipless circuit), which are laminated in a plastic material, the present invention locates the RFID tag in a pocket created in the carrier material or housing. Exemplary RFID tags and inlays suitable for use with the present invention include the N-Flexwing™, AD-222™, AD-223™ or AD-224™ available from Avery Dennison Corporation, Pasadena, Calif.

An exemplary RFID inlay, such as AD-224, has dimensions of about 3.7 inches (about 95 mm) long by about 0.3 inches wide (about 7.5 mm) and a height or thickness, including the height of the integrated circuit or chip, of about 11 mils.

The material used in forming the RFID device for the present invention may include polymers or plastic films, cellulosic stocks, foams or other material suitable for the particular purpose. The structure which is used to create the pocket or cavity can be flexible or rigid. The pocket or cavity allows the inlay to "float" around slightly within the air space created in the cavity or pocket, thereby mitigating many of the problems, such as breaking, fracturing, antenna clipping, etc., associated with laminated or hard RFID tags when they are attached to non-planar or curvilinear surfaces or to flexible articles. That is, in a laminated assembly, the RFID inlay is secured to the surrounding enclosure and when the enclosure is bent or flexed, the RFID inlay, or more specifically the connection between the chip and the antenna can break during the flexing of the assembly.

The pocket or cavity that is created in the present invention may be filled with an inert gas, such as helium or neon in order to avoid any sort of chemical reaction with the inlay contained in the cavity or pocket. In addition, the pocket may be filled with a gel or liquid.

The cavity will preferably be sized and configured to receive an inlay such that the inlay can float freely or move around within the cavity. That is, since the RFID inlay is not physically attached to the surrounding enclosure, the flexing of the enclosure will not cause the chip and antenna connection to break. The cavity or pocket will have a dimension which is at a minimum slightly larger than the dimension of the inlay, and more preferably at least twenty to forty percent larger than the dimension of the inlay to provide ample floating space to allow the RFID inlay to move within the enclosed area of the pocket.

The height of the cavity will preferably be several times greater than the height or thickness of the inlay, such that the housing may flex (when applied to a non-planar or curvilinear surfaces or flexible articles) without the housing coming into contact with the RFID inlay within the cavity.

In one preferred embodiment of the present invention the polymeric or plastic material is sonically welded on the sides and ends away from the sides and ends of the inlay, thereby enclosing or sealing the inlay in the tag without actually having the inlay physically attached to the tag. By allowing the inlay to float in the enclosure, many of the conventional stresses suffered by the inlay when encased in a hardened environment or when affixed to the housing itself can be reduced and in some applications eliminated.

In an additional embodiment, the air space can be filled with an inert gas, such as helium or neon, so as to avoid any type of reaction with the RFID inlay over time. Alternatively, the cavity or pocket may be filled with a gel or a liquid.

In one preferred embodiment of the present invention, the first and second portions of material may be composed of a clear plastic material, or a colored plastic material. In addition, there may be additional additives mixed into the plastic, including chemicals that provide protection against certain wavelengths of light, such as ultraviolet light, or other chemicals such as fire retardant or fire resistant materials. Further-more, the exterior of the completed assembly can be coated with chemicals to make the structure more accommodating to additional encapsulants for example when the tag is incorporated into in mold or injection molding applications to help a portion of the tag bond with the mold materials.

Reference is now directed to FIG. 1 which is a perspective view of a portion of a plastic housing assembly designated generally by reference numeral 10. While The embodiment of FIG. 1 shows an exemplary method of creating a molded assembly, it should be understood that other methods may be used for creating the assembly of the present invention as will be described herein.

FIG. 1 shows a plurality of RFID devices 12 disposed in a plurality of cavities 14, with one RFID device in each cavity. The housings are separable from one another via lines of weakness 16, which may be score lines, perforations or simply cut lines that a guillotine or other cutting mechanism may use to separate the individual housings.

Figure 2:
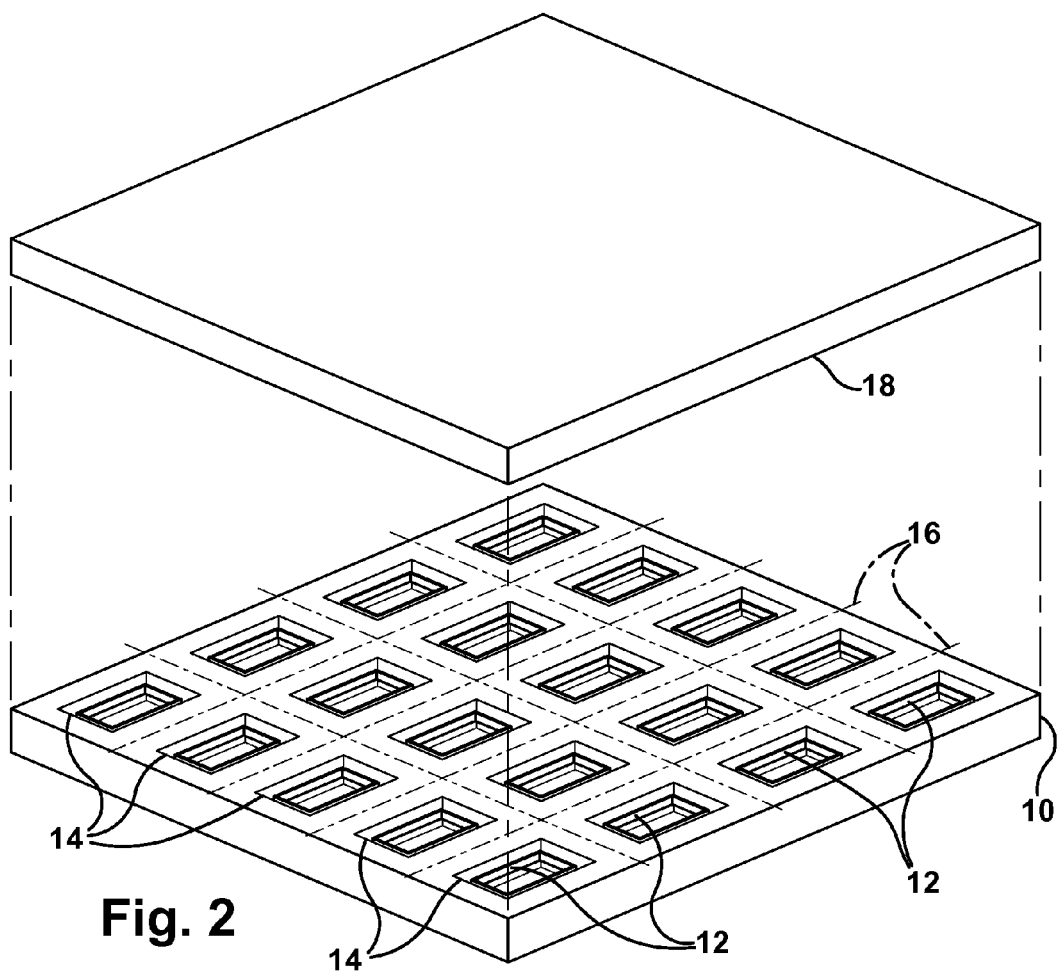
FIG. 2 is a perspective view of a cover being placed over the cavities to create an enclosed housing.

FIG. 2 provides a perspective view of a group of cavities 14 on a flexible substrate having RFID devices 12 positioned within each cavity. A series of separation or cut lines 16 are provided to enable separation of the individual RFID housings from one another.

Figure 3:
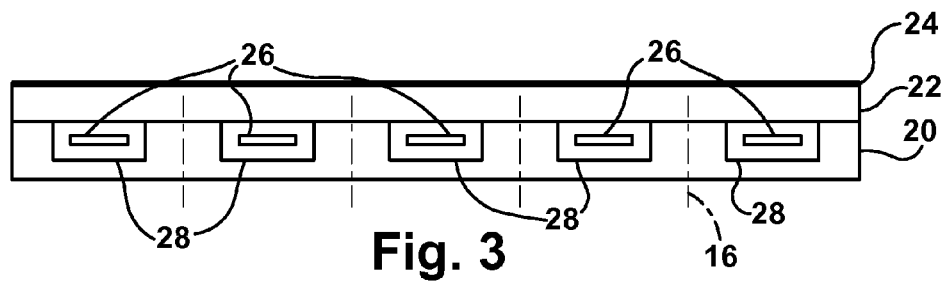
FIG. 3 is a perspective view of the enclosed housing.

FIG. 3 is a perspective view of the sealed assembly 22 having a lower portion 20 and an upper portion 24. The upper portion 24 encloses each of the cavities 28 with each cavity containing an RFID device.

The upper portion 24 may be adhesively bonded to the lower portion 20 or fastened by other means. Preferably, the upper portion 24 is ultrasonically bonded to the lower portion 20. Alternatively, the portions may be welded together by RF energy or be thermally or adhesively bonded to one another.

It should be understood, that while the invention has been described as illustrating an assembly using a multiple cavity mold, the RFID tag along with the associated housing with a cavity can be produced as individual units or as part of blow molding application where an RFID inlay is placed in a mold and a plastic film is blown around the RFID inlay.

Reference is now directed to FIG. 4 which shows an exploded view of an RFID assembly produced in accordance with another method of the present invention. A first flexible material or substrate 100 is provided and has first and second sides 110 and 112, respectively. The substrate 100 has first and second lines 114 and 116 which will define at least a portion of the outer boundary of the encapsulation zone to be described herein.

A second flexible substrate or material is provided at 120. The second substrate 120 has first and second surfaces 122 and 124 with first and second lines 126 and 128 defining at least a portion of the encapsulation zone that will be mated to the first substrate 100 such that the first and second lines (114, 116, 126 and 128) of each of the first and second substrates 100 and 120 are relatively in alignment with one another.

FIG. 5 provides the RFID assembly of the present invention in a sealed or enclosed arrangement. The assembly is designated generally as 150 and has an encapsulation area generally designated as 160. The encapsulation area or zone 160 will typically have the same general geometric configuration as the RFID inlay, here depicted as generally rectangular. The encapsulation zone 160 defines an air space 165 in which the inlay 170 is placed. The RFID inlay has an antenna 172 and a chip 174. The air space 165 is created by ultrasonically welding the first and second substrates together around the inlay 170. Alternatively, the substrates can be joined by RF welding, thermal or adhesive bonding.

Figure 6:
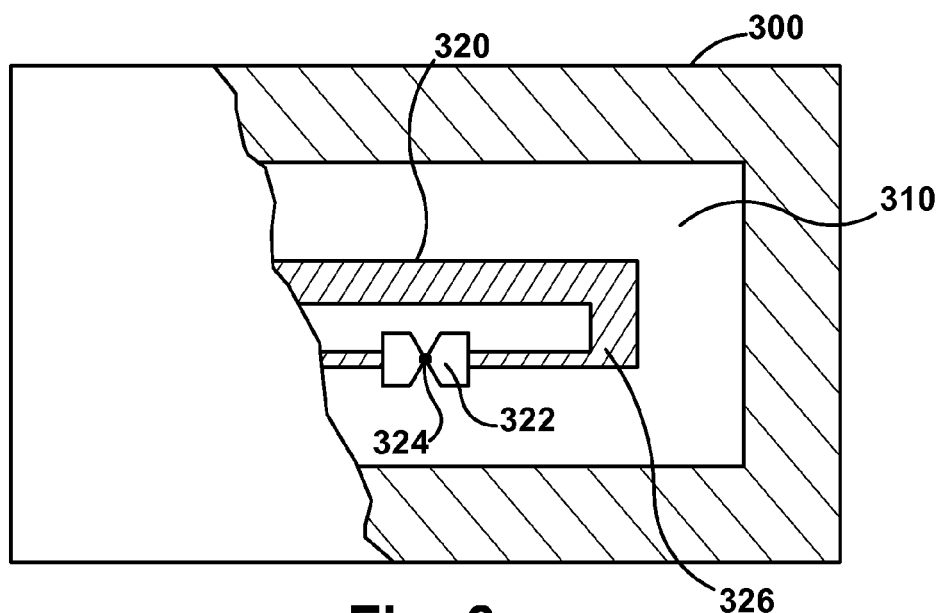
FIG. 6 is a perspective view showing a section of a single housing containing an RFID device within a cavity.

Turning now to FIG. 6, a housing 300 is shown. The housing may be rigid or flexible. The housing 300 has a cavity 310 created within the housing 300. The cavity 310 has a first dimension. An RFID inlay 320 is provided within the cavity 300 of the housing. The RFID inlay 320 includes a strap 322 having a chip 324, which would include product information such as the electronic product code (EPC) that is connected to an antenna 326. The RFID inlay 320 has a second dimension that is less than the first dimension of the cavity.

Figure 7:
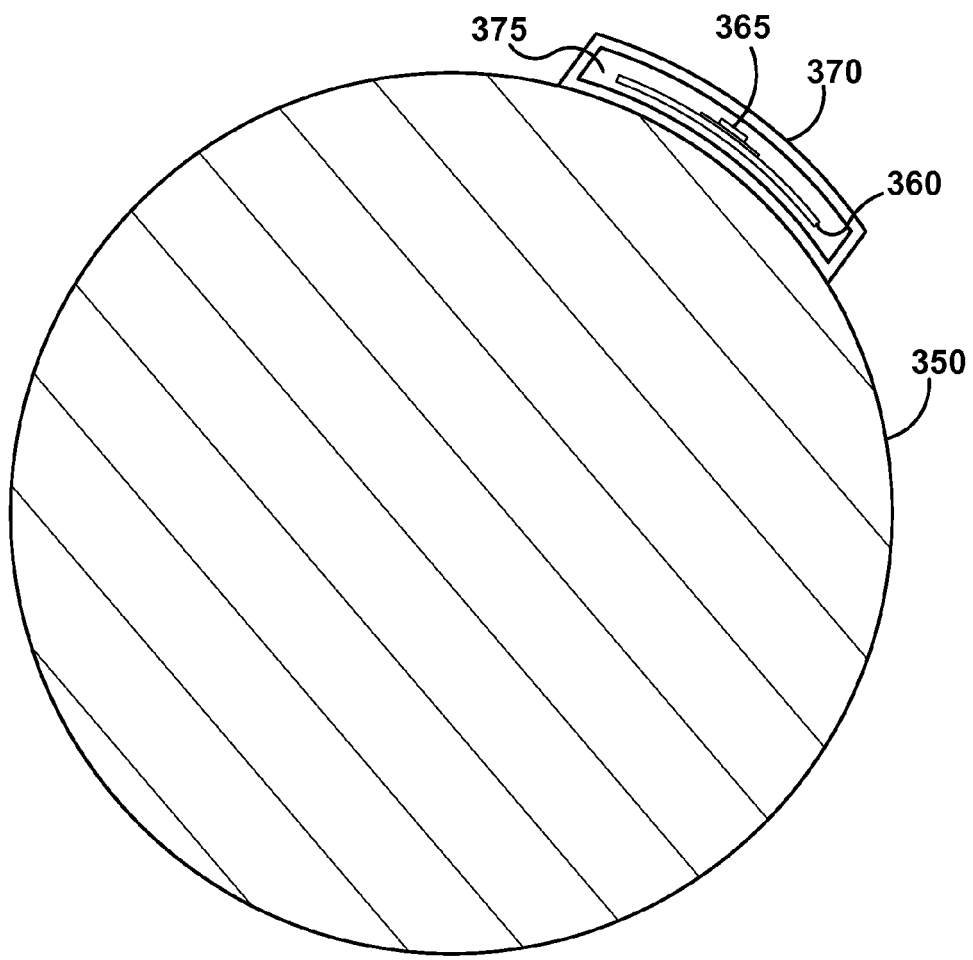
FIG. 7 is a perspective view of a single housing attached to an article or package.

Reference is now directed at FIG. 7 which includes an article or package 350 to which an RFID device 360, which includes an RFID chip 365 encoded with information relating to the article. The RFID device 360 has been attached via a housing 370. In the present example, the article 350 is a curved or non-planar item and the RFID device 360 has been applied to the article as part of a flexible housing 370 which has been provided in a curvilinear configuration. The housing 370 has an air space 375 in which the RFID device 360 is suspended. The air space 375 allows the RFID device 360 to bend partially along the curvilinear surface.

While an external surface has been depicted in FIG. 7, the invention may be used for example on a garment or article of clothing and the RFID housing may be sewn into or otherwise attached to a collar or interior of the garment. The flexing of the garment or article of clothing, such as may occur during the washing of the article would then not cause the RFID device to break due to the space in the housing around the RFID inlay.

It should be understood that while the RFID devices are in one embodiment free floating, the RFID devices can be partially attached to the cavity such as by an end edge of the inlay or device. That is when the second piece of material is attached to the first piece of material an end edge is used to hold the RFID device in a particular position but still allow the majority of the RFID to float thus accommodating flexing of the structure.

It will thus be seen according to the present invention a highly advantageous encapsulated RFID assembly has been provided. While the invention has been described in connection with what is presently considered to be the most practical and preferred embodiment, it will be apparent to those of ordinary skill in the art that the invention is not to be limited to the disclosed embodiment, and that many modifications and equivalent arrangements may be made thereof within the scope of the invention, which scope is to be accorded the broadest interpretation of the appended claims so as to encompass all equivalent structures and products.

The inventors hereby state their intent to rely on the Doctrine of Equivalents to determine and assess the reasonably fair scope of their invention as it pertains to any apparatus, system, method or article not materially departing from but outside the literal scope of the invention as set out in the following claims.

The invention claimed is:

1. An RFID device for use on flexible surfaces, comprising;
   a first flexible material having a first face and a second face and first and second lines to define a a portion of an outer boundary of an encapsulation zone;
   a second flexible material having a first face and a second face and first and second lines to define a portion of an outer boundary of the encapsulation zone;
   the first and second lines of the first material and the first and second lines of the second material are relatively in alignment with one another to form the encapsulation zone;
   an RFID inlay disposed between the second face of the first flexible material and the first face of the second flexible material in the encapsulation zone, the RFID inlay having a first dimension;

the encapsulation zone having a second dimension larger that the first dimension; and wherein the RFID inlay is enclosed within the encapsulation zone and is free floating.

2. The RFID device of claim 1, wherein at least the first material is composed of a foam, flexible material, or combinations thereof.

3. The RFID device of claim 1, wherein at least the first material comprises a material resistant to degradation from certain levels of light.

4. The RFID device of claim 1, wherein at least the first material includes a fire resistant or retardant material.

5. The RFID device of claim 1, wherein the encapsulation zone is filled with a material which may be selected from a group comprising an inert gas, gel or liquid.

6. The RFID device of claim 1, wherein the encapsulation zone is formed by sonic welding, RF welding, thermal bonding, adhesive bonding or combinations thereof.

7. The RFID device of claim 1, wherein the encapsulation zone includes an air space.

8. The RFID device of claim 1, wherein the flexible surface is a garment.

9. The RFID device of claim 1, wherein the RFID device is separated from a group of cavities on a flexible substrate.

10. The RFID device of claim 9, wherein the RFID device is separated from the group of cavities by lines of weakness, score lines, perforations or cut lines.

11. The RFID device of claim 1, wherein the RFID device is partially attached to a face of the encapsulation zone by an end edge of the RFID inlay.

12. An RFID device attached to a package, comprising:
a package;
an RFID device, the RFID device comprising;
a first flexible material having a first face and a second face and first and second lines to define a portion of an outer boundary of an encapsulation zone;
a second flexible material having a first face and a second face and first and second lines to define a portion of an outer boundary of the encapsulation zone;
the first and second lines of the first material and the first and second lines of the second material are relatively in alignment with one another to form the encapsulation zone;
an RFID inlay disposed between the second face of the first flexible material and the first face of the second flexible material in the encapsulation zone, the RFID inlay having a first dimension;
the encapsulation zone having a second dimension larger that the first dimension; and
wherein the RFID inlay is enclosed within the encapsulation zone and is free floating.

13. The RFID device of claim 12, wherein the RFID inlay having an electronic product code unique to the package disposed in the encapsulation zone.

* * * * *